(12) United States Patent
Tajima et al.

(10) Patent No.: US 9,385,900 B2
(45) Date of Patent: Jul. 5, 2016

(54) SIGNAL TRANSMISSION SYSTEM

(71) Applicants: Kenichi Tajima, Tokyo (JP); Kenji Kawakami, Tokyo (JP); Akihito Hirai, Tokyo (JP); Masanobu Hiramine, Tokyo (JP)

(72) Inventors: Kenichi Tajima, Tokyo (JP); Kenji Kawakami, Tokyo (JP); Akihito Hirai, Tokyo (JP); Masanobu Hiramine, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/379,078

(22) PCT Filed: Mar. 19, 2013

(86) PCT No.: PCT/JP2013/057821
§ 371 (c)(1),
(2) Date: Aug. 15, 2014

(87) PCT Pub. No.: WO2013/153922
PCT Pub. Date: Oct. 17, 2013

(65) Prior Publication Data
US 2015/0030064 A1    Jan. 29, 2015

(30) Foreign Application Priority Data

Apr. 9, 2012 (JP) ................. 2012-088468

(51) Int. Cl.
*H03K 7/04*      (2006.01)
*H04L 25/49*    (2006.01)
*H03M 5/12*      (2006.01)

(52) U.S. Cl.
CPC ............. *H04L 25/4902* (2013.01); *H03M 5/12* (2013.01)

(58) Field of Classification Search
CPC ............ H04L 25/4902; H04L 25/4904; H04L 1/0061; H04L 7/0066; H04L 7/033
USPC .................... 375/295, 316, 340, 361
See application file for complete search history.

(56) References Cited

U.S. PATENT DOCUMENTS

| 4,805,197 | A | * | 2/1989 | Van Der Jagt et al. | 375/361 |
| 5,687,193 | A |   | 11/1997 | Abou Hassan | |
| 5,825,812 | A | * | 10/1998 | Babitch | 375/146 |
| 6,137,850 | A | * | 10/2000 | Miller | 375/354 |
| 7,088,270 | B1 | * | 8/2006 | Dally et al. | 341/70 |

(Continued)

FOREIGN PATENT DOCUMENTS

| JP | S64-013820 A | 1/1989 |
| JP | H02-065318 A | 3/1990 |

(Continued)

OTHER PUBLICATIONS

International Search Report; PCT/JP2013/057821; Apr. 16, 2013.

(Continued)

*Primary Examiner* — Khanh C Tran
(74) *Attorney, Agent, or Firm* — Studebaker & Brackett PC

(57) ABSTRACT

A signal transmission system has a modulation signal converter 1 that generates a modulation signal using a Manchester code with a duty ratio of 50% in accordance with transmission data; a clock generator 6 that generates a clock with the amount of delay with respect to the rising or falling edge of the modulation signal; and a data detector 5 that generates received data by sampling the modulation signal in synchronization with the clock. Since the modulation signal converter 1 generates the modulation signal by combining the Manchester code with the duty ratio of 50%, its duty ratio is always 50% independently of the transmission data, thereby preventing the DC offset of the modulation signal on the receiving side. Accordingly, it offers an advantage of achieving good communication quality with a simple circuit configuration without producing the DC offset in the modulation signal on the receiving side.

9 Claims, 13 Drawing Sheets

(56) References Cited

U.S. PATENT DOCUMENTS

| | | |
|---|---|---|
| 2002/0097075 A1 | 7/2002 | Ono et al. |
| 2006/0165195 A1* | 7/2006 | Dally et al. ............... 375/316 |
| 2006/0188048 A1* | 8/2006 | Suzuki et al. ............. 375/361 |
| 2007/0195911 A1* | 8/2007 | Ochi .......................... 375/324 |
| 2009/0110111 A1* | 4/2009 | Kato et al. ................. 375/295 |
| 2009/0323828 A1* | 12/2009 | Sugita et al. .............. 375/257 |
| 2012/0033774 A1* | 2/2012 | Tanaka et al. ............. 375/371 |
| 2015/0023458 A1* | 1/2015 | Ngo ........................... 375/361 |

FOREIGN PATENT DOCUMENTS

| | | |
|---|---|---|
| JP | 2002-217697 A | 8/2002 |
| JP | 2005-203093 A | 7/2005 |

OTHER PUBLICATIONS

D. Cheewasrirungraung et al.; "A Multi-Gigabit DLL-based CMOS PWM Demodulator Using Delay Vernier Sampler"; 2010 International Conference on ECTI-CON.

The extended European search report issued by the European Patent Office on Nov. 2, 2015, which corresponds to European Patent Application No. 13776218.3-1860 and is related to U.S. Appl. No. 14/379,078.

Daoud, D. et al.; "Fully Integrated CMOS Data and Clock Recovery for Wireless Biomedical Implants"; Systems, Signals and Devices (SSD); 2011, 8th International Multi-Conference On IEEE; Mar. 22, 2011; pp. 1-5.

* cited by examiner

- PRIOR ART -

- PRIOR ART -

SIGNAL TRANSMISSION SYSTEM

TECHNICAL FIELD

The present invention relates to a signal transmission system used for a wire or wireless communication system.

BACKGROUND ART

FIG. 14 is a block diagram showing a configuration of a conventional signal transmission system disclosed in the following Non-Patent Document 1.

The signal transmission system shown in FIG. 14 comprises a pulse width modulator 101 and a transmission frequency converter 102 in a transmission side.

In addition, it comprises a receiving frequency converter 103 and a decoder 104 in a receiving side via a transmission line, and the decoder 104 comprises a data detector 105 and a delay circuit 106 (the amount of delay T=0.5 T).

Next, the operation will be described.

In the transmission side, the pulse width modulator 101 is supplied with transmission data ("0" or "1") with a period T, generates a modulation signal (PWM signal) with a pulse width corresponding to the transmission data, and the transmission frequency converter 102 converts it to a desired carrier frequency and transmits it.

It is assumed here that the transmission data "0" has a pulse width not greater than 0.5 T (0.25 T, for example), and the transmission data "1" has a pulse width not less than 0.5 T (0.75 T, for example).

In the receiving side, the receiving frequency converter 103 carries out the frequency conversion of the PWM signal to a baseband, and supplies it to the decoder 104.

In the decoder 104, using as the clock the PWM signal to which a 0.5 T time delay is added through the delay circuit 106, the data detector 105 operates in synchronization with a rising edge of the clock, and samples the PWM signal to obtain the received data.

FIG. 15 shows an example of the temporal waveforms of the transmission data, PWM signal, clock, and received data.

As described above, by using the received PWM signal as the clock, the conventional signal transmission system can obtain the received data without using such a clock generator as disclosed in the following Patent Document 1.

PRIOR ART DOCUMENT

Patent Document

Patent Document 1: Japanese Patent Laid-Open No. 64-13820/1989.

Non-Patent Document

Non-Patent Document 1: D. Cheewasrirungraung, "A Multi-Gigabit DLL-based CMOS PWM Demodulator Using Delay Vernier Sampler", 2010 International Conference on ECTI-CON.

DISCLOSURE OF THE INVENTION

Problems to be Solved by the Invention

In the conventional signal transmission system with the foregoing configuration, since the PWM signal varies its pulse width in conformity with the transmission data ("0" or "1"), depending on a data sequence (consecutive "0"s or "1"s, for example), the PWM signal on the receiving side has a DC offset.

The increased DC offset can cause a malfunction of the data detector 105, and will arise a problem of being unable to obtain the correct received data as a result.

The present invention is implemented to solve the foregoing problem. Therefore it is an object of the present invention to realize a signal transmission system capable of obtaining good communication quality with a simple circuit configuration without causing the DC offset in the modulation signal on the receiving side.

Means for Solving the Problems

A signal transmission system in accordance with the present invention comprises: a modulation signal generating unit that generates a modulation signal using a Manchester code in accordance with transmission data; a clock generating unit that generates a clock having an amount of delay with respect to a rising edge or falling edge of the modulation signal; and a data detecting unit that generates received data by carrying out sampling processing of the modulation signal in synchronization with the clock.

Advantages of the Invention

According to the present invention, since the modulation signal generating unit generates the modulation signal by combining the Manchester code, the transmission data does not cause the DC offset in the modulation signal in the receiving side.

Accordingly, the modulation signal in the receiving side does not have the DC offset, thereby offering an advantage of being able to achieve good communication quality with a simple circuit configuration.

BEST MODE FOR CARRYING OUT THE INVENTION

The best mode for carrying out the invention will now be described with reference to the accompanying drawings to explain the present invention in more detail.

Embodiment 1

Figure 1:
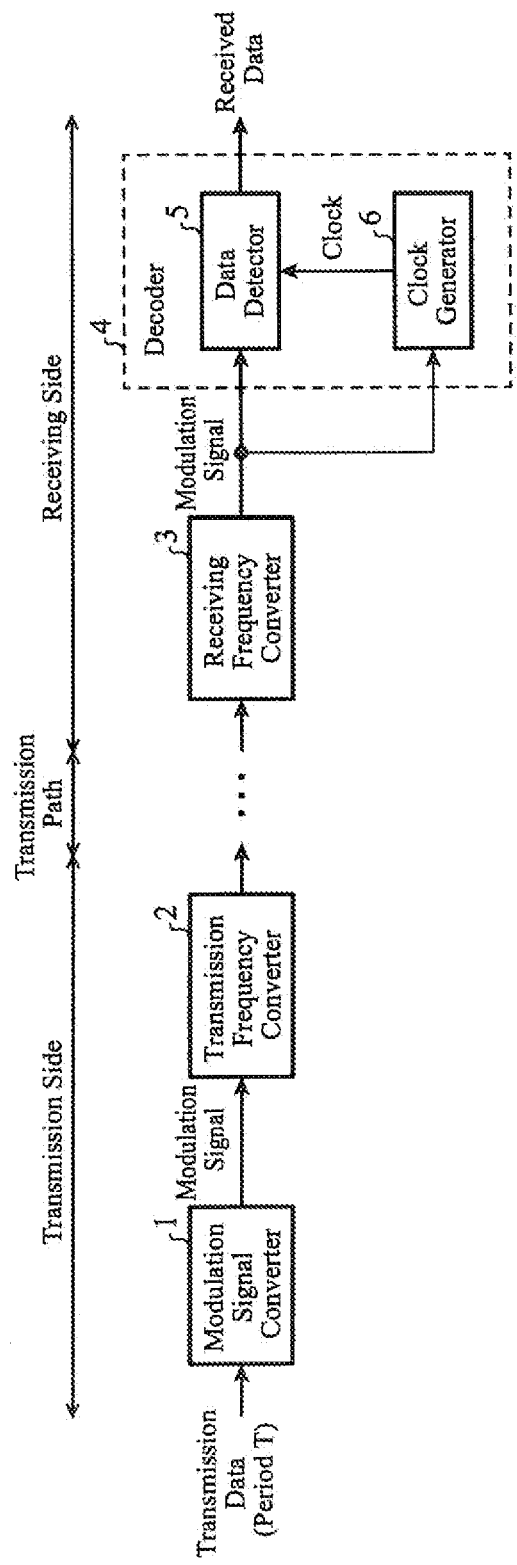
FIG. 1 is a block diagram showing a configuration of a signal transmission system of an embodiment 1 in accordance with the present invention.

FIG. 1 is a block diagram showing a configuration of a signal transmission system of an embodiment 1 in accordance with the present invention.

The signal transmission system shown in FIG. 1 comprises in the transmission side a modulation signal converter (modulation signal generating unit) 1 that generates a modulation signal using a Manchester code with the duty ratio of 50% corresponding to the transmission data, and a transmission frequency converter (first frequency converter) 2 that converts the modulation signal generated by the modulation signal converter 1 to a desired carrier frequency.

In addition, the signal transmission system comprises in the receiving side via the transmission line a receiving frequency converter (second frequency converter) 3 that converts the modulation signal passing through the conversion to the desired carrier frequency by the transmission frequency converter 2 to a baseband frequency, and a decoder 4 that decodes the modulation signal passing through the conversion to the baseband frequency by the receiving frequency converter 3.

Furthermore, the decoder 4 comprises a clock generator (clock generating unit) 6 that generates a clock with the amount of delay with respect to the rising edge or falling edge of the modulation signal, and a data detector (data detecting unit) 5 that carries out sampling processing of the modulation signal in synchronization with the clock generated by the clock generator 6, and generates the received data.

It is supposed in the example of FIG. 1 that the components of the signal transmission system, that is, the modulation signal converter 1, transmission frequency converter 2, receiving frequency converter 3 and decoder 4 are comprised of hardware such as a semiconductor circuit board incorporating a microcomputer, for example.

Next, the operation will be described.

In the transmission side, the modulation signal converter 1 is supplied with the transmission data ("0" or "1") with the period T and generates the modulation signal using the Manchester code with the duty ratio of 50% corresponding to the transmission data, and the transmission frequency converter 2 converts it to the desired carrier frequency and transmits it.

Incidentally, the generation algorithm of the modulation signal is shown from FIG. 3 to FIG. 6.

In the receiving side, the modulation signal which is frequency-converted to the baseband by the receiving frequency converter 3 is supplied to the decoder 4.

In the decoder 4, the clock generator 6 generates the clock by adding the time delay of $\alpha T$ to a rising edge of the modulation signal, and the data detector 5 obtains the received data by carrying out the sampling of the modulation signal in synchronization with the rising edge of the clock.

Here $\alpha$ is a value in one of three ranges of not less than 0.5 T to not greater than 1 T, not less than 1 T to not greater than 1.5 T, and not less than 1.5 T to not greater than 2 T.

Figure 2:
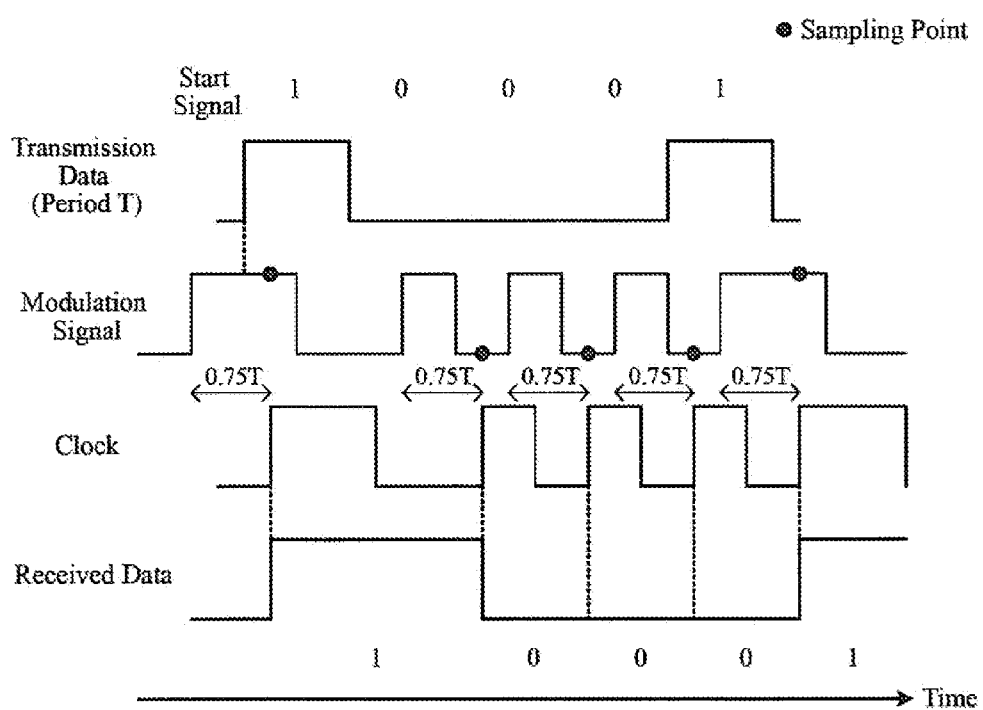
FIG. 2 is a timing chart showing temporal waveforms of various signals.

FIG. 2 shows an example of temporal waveforms of the transmission data, modulation signal, clock, received data when $\alpha=0.75$ T.

The modulation signal converter 1 outputs the Manchester code with the duty ratio of 50% as the start signal, first, and after the start signal, it outputs the modulation signal generated in correspondence to the transmission data.

The clock has a time delay of 0.75 T with respect to the received modulation signal, and the value of the modulation signal at the rising edge of the clock becomes received data.

The value of the received data is maintained until the next clock rises.

As shown in FIG. 2, the signal transmission system of the embodiment 1 can transmit the data correctly.

Figure 3:
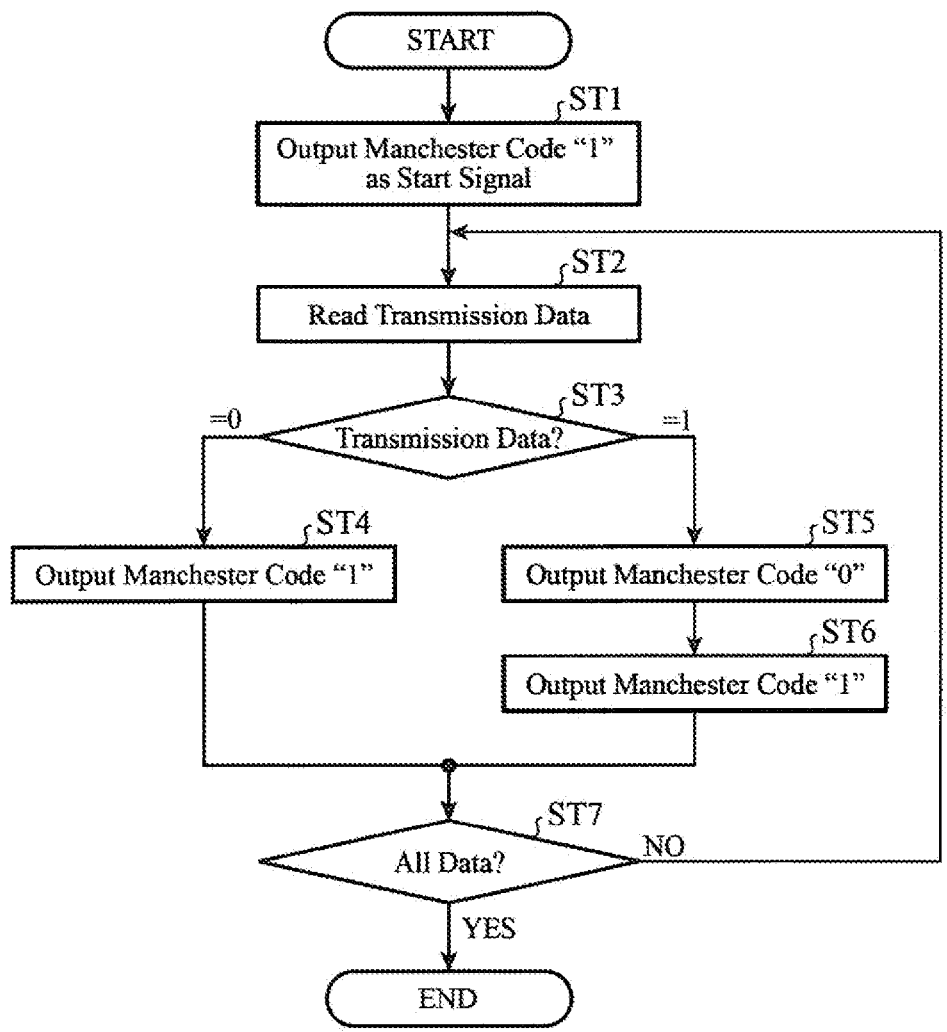
FIG. 3 is a flowchart showing a generation algorithm of a modulation signal (when α is not less than 0.5 T and not greater than 1 T)

FIG. 3 shows a generation algorithm of the modulation signal when $\alpha$ is not less than 0.5 T and not greater than 1 T.

First, the modulation signal converter 1 outputs the Manchester code "1" with the duty ratio of 50% as the start signal (step ST1).

Next, it outputs the Manchester code with the duty ratio of 50% corresponding to the value of the transmission data read (steps ST2-ST7).

When the transmission data is "0" (step ST3), it outputs the Manchester code "1" with the duty ratio of 50% (step ST4).

When the transmission data is "1", it outputs the Manchester code "0" with the duty ratio of 50% (step ST5), followed by outputting the Manchester code "1" with the duty ratio of 50% (step ST6).

Until conversion of all the transmission data has been completed, the operation from reading to conversion of the transmission data is carried out repeatedly (step ST7).

Figure 4:
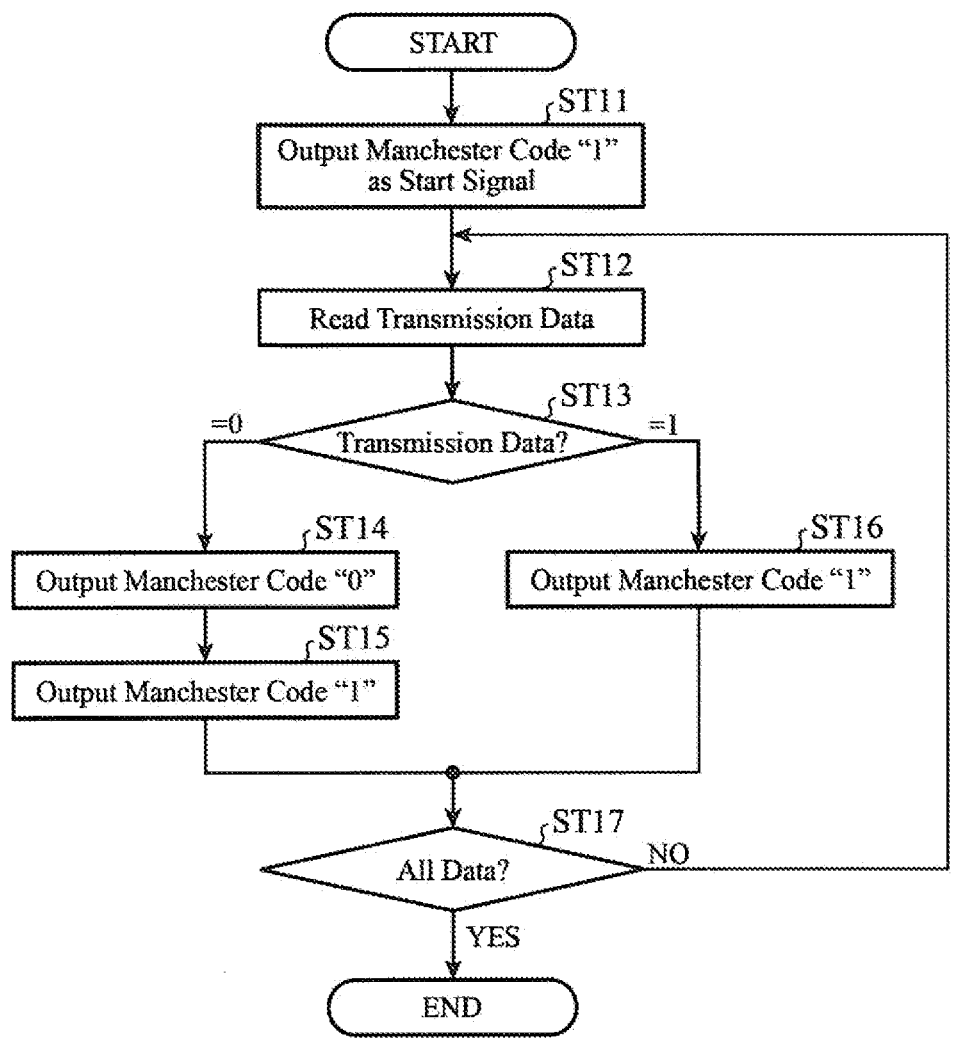
FIG. 4 is a flowchart showing a generation algorithm of the modulation signal (when α is not less than 1 T and not greater than 1.5 T)

FIG. 4 shows a generation algorithm of the modulation signal when $\alpha$ is not less than 1 T and not greater than 1.5 T.

First, the modulation signal converter 1 outputs the Manchester code "1" with the duty ratio of 50% as the start signal (step ST11).

Next, it outputs the Manchester code with the duty ratio of 50% corresponding to the value of the transmission data read (step ST12-ST17).

When the transmission data is "0" (step ST13), it outputs the Manchester code "0" with the duty ratio of 50% (step ST14), followed by outputting the Manchester code "1" with the duty ratio of 50% (step ST15).

When the transmission data is "1" (step ST13), it outputs the Manchester code "1" with the duty ratio of 50% (step ST16).

Until conversion of all the transmission data has been completed, the operation from reading to conversion of the transmission data is carried out repeatedly (step ST17).

Figure 5:
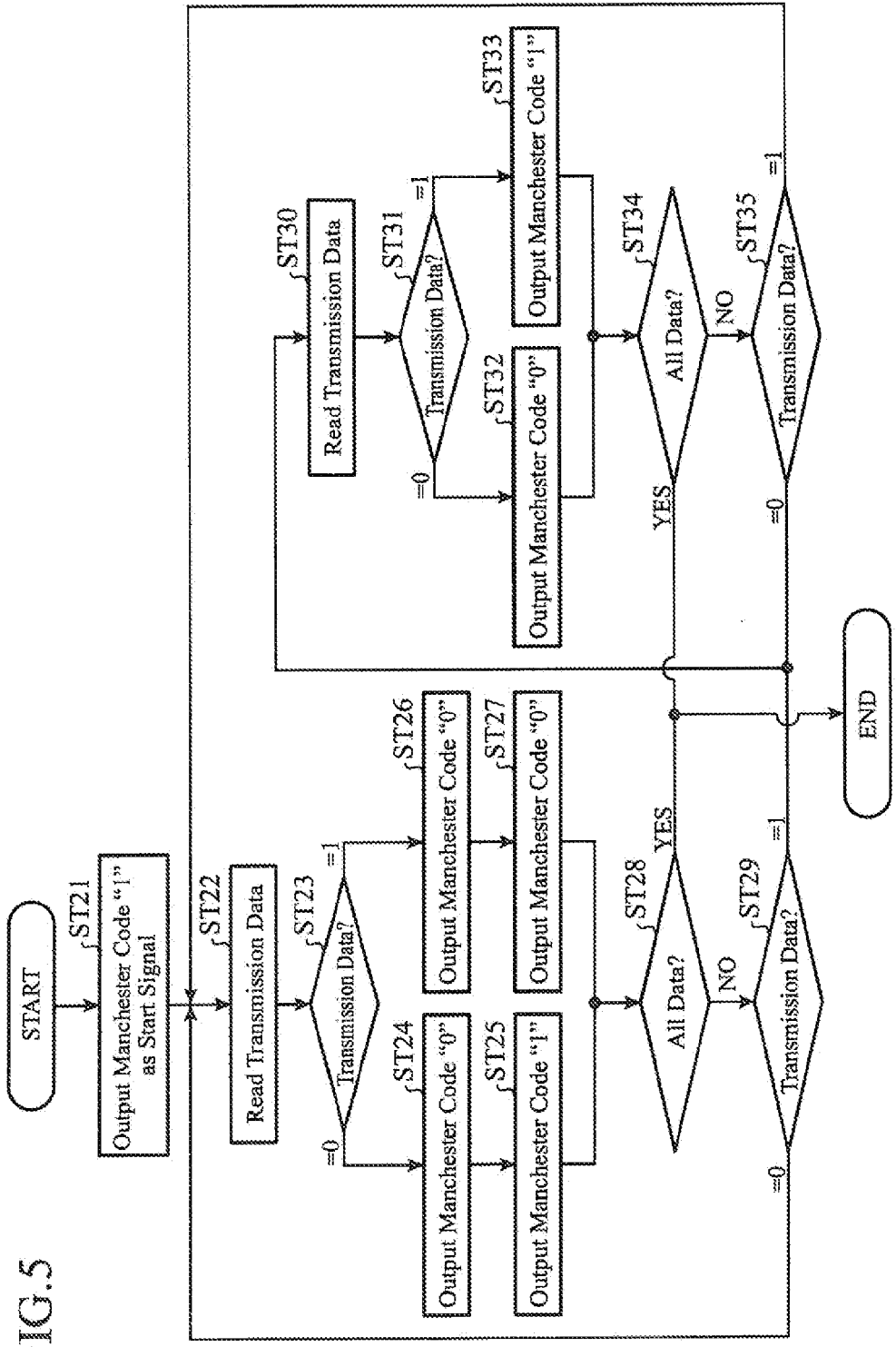
FIG. 5 is a flowchart showing a generation algorithm of the modulation signal (when α is not less than 1.5 T and is not greater than 2 T, and when a start signal is Manchester code "1")
Figure 6:
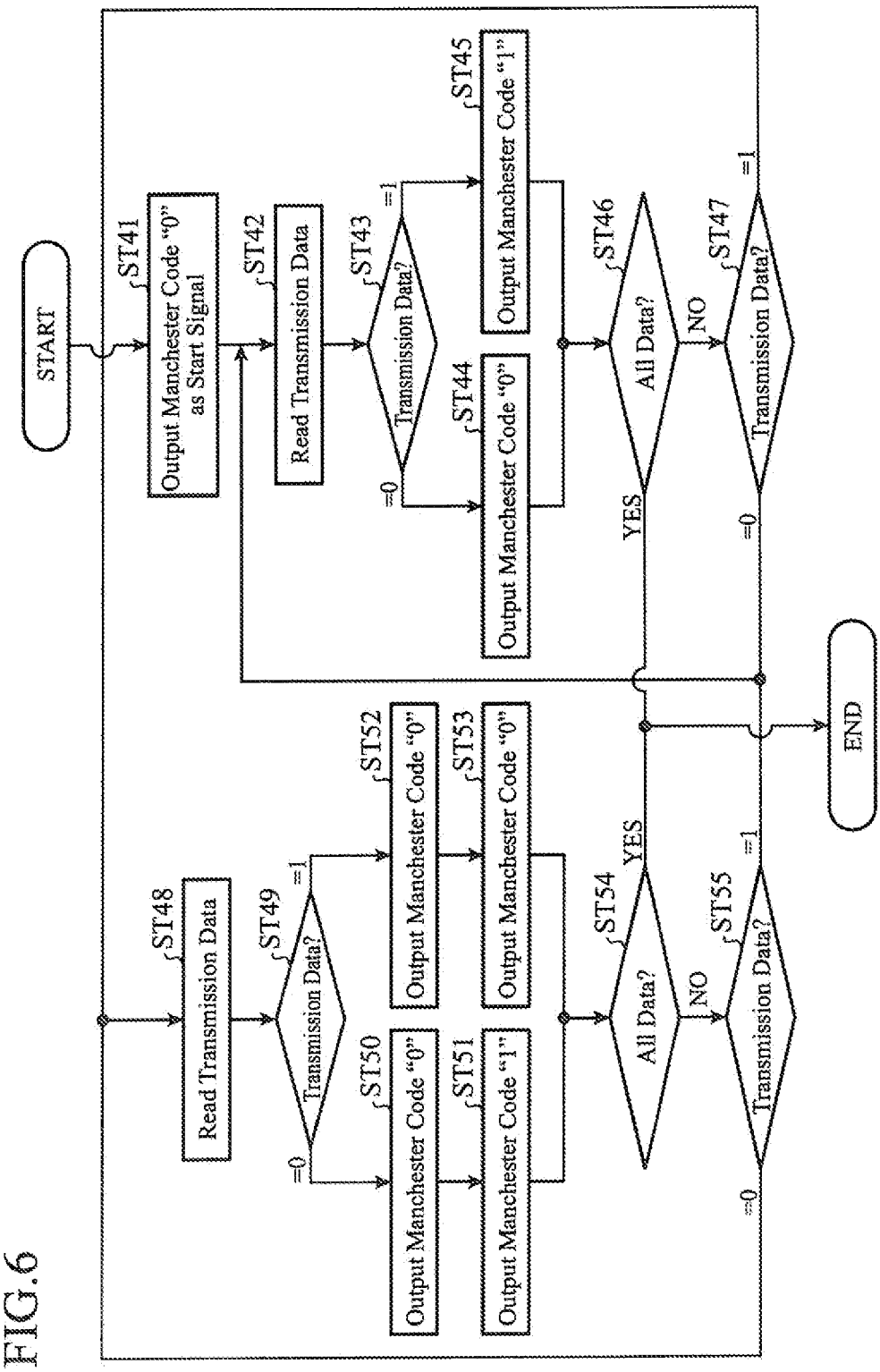
FIG. 6 is a flowchart showing a generation algorithm of the modulation signal (when a is not less than 1.5 T and is not greater than 2 T, and when the start signal is Manchester code "0")

FIG. 5 and FIG. 6 shows a generation algorithm of the modulation signal when a is not less than 1.5 T and not greater than 2 T.

FIG. 5 shows the case where the start signal is the Manchester code "1" with the duty ratio of 50%.

First, the modulation signal converter 1 outputs the Manchester code "1" with the duty ratio of 50% as the start signal (step ST21).

Next, it outputs the Manchester code with the duty ratio of 50% corresponding to the value of the transmission data read (step ST22-ST35).

When the transmission data is "0" (step ST23), it outputs the Manchester code "0" with the duty ratio of 50% (step ST24), followed by outputting the Manchester code "1" with the duty ratio of 50% (step ST25).

When the transmission data is "1" (step ST23), it outputs the Manchester code "0" with the duty ratio of 50% (step ST26), followed by outputting the Manchester code "0" with the duty ratio of 50% (step ST27).

When the transmission data is "0" (step ST29), it carries out the operation from reading to conversion of the transmission data on the left side of FIG. 5 (step ST22-ST28).

When the transmission data is "1" (step ST29), it carries out the operation from reading to conversion of the transmission data on the right side of FIG. 5 (step ST30-ST34).

The operation from reading to conversion of the transmission data on the right side of FIG. 5 will be described (step ST30-ST34).

When the transmission data read is "0" (step ST31), the modulation signal converter 1 outputs the Manchester code "0" with the duty ratio of 50% (step ST32).

When the transmission data read is "1" (step ST31), it outputs the Manchester code "1" with the duty ratio of 50% (step ST33).

When the transmission data is "0" (step ST35), it carries out the operation from reading to conversion of the transmission data on the right side of FIG. 5 (step ST30-ST34).

When the transmission data is "1" (step ST35), it carries out the operation from reading to conversion of the transmission data on the left side of FIG. 5 (step ST22-ST28).

Until conversion of all the transmission data has been completed, the operation described above (step ST22-ST35) is carried out repeatedly (step ST28 and ST34).

FIG. 6 illustrates the case where the start signal is the Manchester code "0" with the duty ratio of 50%.

First, the modulation signal converter 1 outputs the Manchester code "0" with the duty ratio of 50% as the start signal (step ST41).

Next, it outputs the Manchester code with the duty ratio of 50% corresponding to the value of the transmission data read (step ST42-ST45).

When the transmission data is "0" (step ST43), it outputs the Manchester code "0" with the duty ratio of 50% (step ST44).

When the transmission data is "1" (step ST43), it outputs the Manchester code "1" with the duty ratio of 50% (step ST45).

When the transmission data is "0" (step ST47), it carries out the operation from reading to conversion of the transmission data on the right side of FIG. 6 (step ST42-ST46).

When the transmission data is "1" (step ST47), it carries out the operation from reading to conversion of the transmission data on the left side of FIG. 6 (step ST48-ST54).

The operation from reading to conversion of the transmission data on the left side of FIG. 6 will be described (step ST48-ST54).

When the transmission data read is "0" (step ST49), the modulation signal converter 1 outputs the Manchester code "0" with the duty ratio of 50% (step ST50), followed by outputting the Manchester code "1" with the duty ratio of 50% (step ST51).

When the transmission data read is "1" (step ST49), it outputs the Manchester code "0" with the duty ratio of 50% (step ST52), followed by outputting the Manchester code "0" with the duty ratio of 50% (step ST53)

When the transmission data is "0" (step ST55), it carries out the operation from reading to conversion of the transmission data on the left side of FIG. 6 (step ST48-ST54).

When the transmission data is "1" (step ST55), it carries out the operation from reading to conversion of the transmission data on the right side of FIG. 6 (step ST42-ST46).

Until conversion of all the transmission data has been completed, the operation described above (step ST41-ST55) is carried out repeatedly (steps ST46 and ST54).

As described above, according to the present embodiment 1, since the modulation signal converter 1 generates the modulation signal by combining the Manchester code with the duty ratio of 50%, the duty ratio always becomes 50% independently of the transmission data. Thus, it can prevent the modulation signal on the receiving side from producing the DC offset.

Accordingly, the present embodiment 1 can prevent the modulation signal on the receiving side from bringing about the DC offset, thereby being able to obtain good communication quality with a simple circuit configuration.

Figure 14:
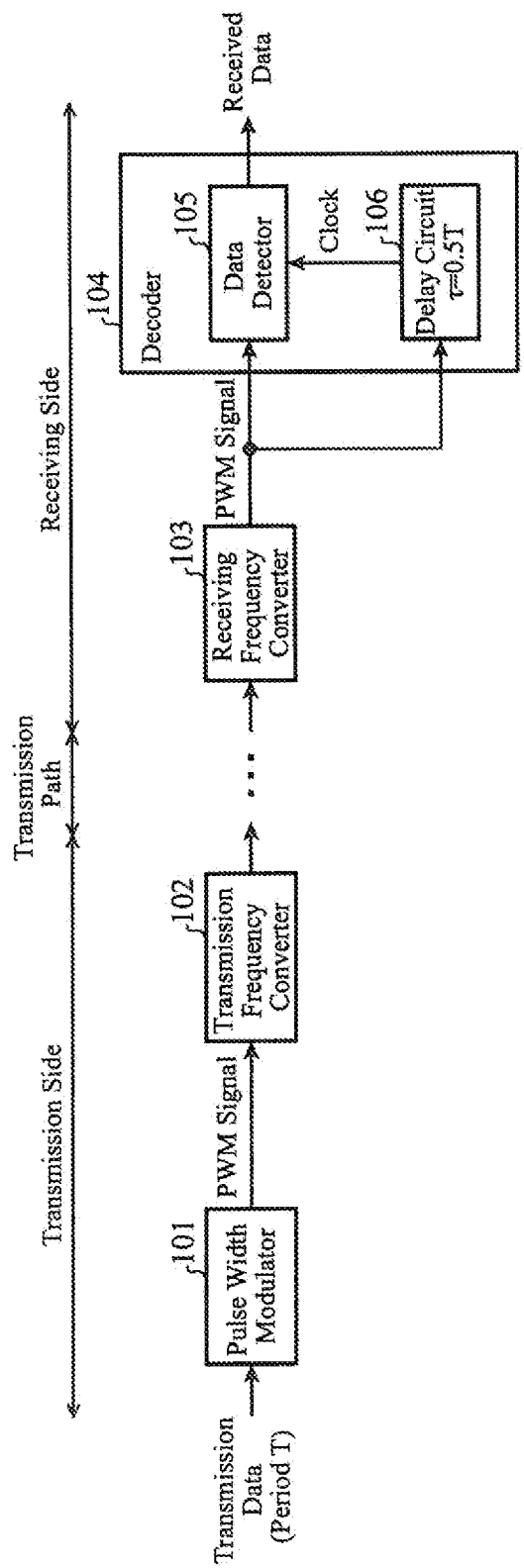
FIG. 14 is a block diagram showing a configuration of a conventional signal transmission system.
Figure 15:
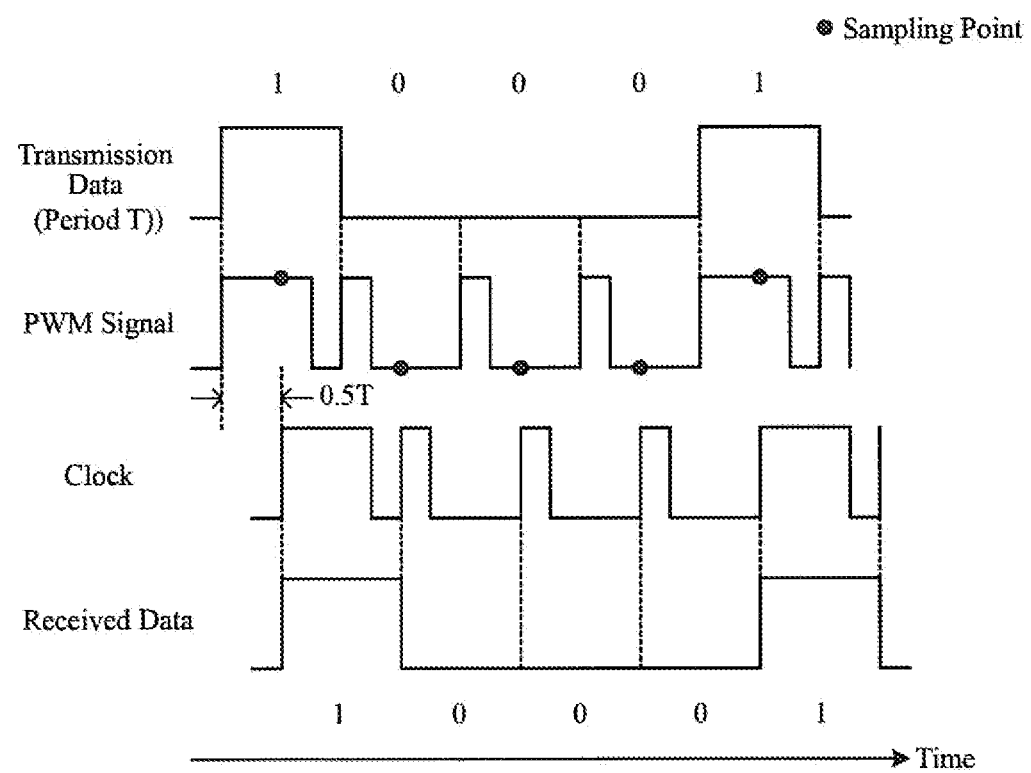
FIG. 15 is a timing chart showing temporal waveforms of various signals.

In addition, the conventional pulse width modulator 101 in the FIG. 14 can have the operating clock with a pulse width greater than 0.5 T depending on the set resolution of the pulse width.

Thus, it offers problems of increasing the power consumption of the pulse width modulator 101, of complicating the circuit configuration of the pulse width modulator 101, and the like.

In contrast with this, since the modulation signal converter 1 in FIG. 1 of the embodiment 1 has the operating clock with the width fixed at 0.5 T, its circuit configuration becomes simpler than the pulse width modulator 101, and its power consumption becomes smaller.

Accordingly, it can achieve good communication quality with a simpler circuit configuration.

As for the clock generator 6, although the present embodiment 1 does not describe its details, it can be an analog circuit using a delay element, or a digital circuit using a counter, achieving the same advantages.

Embodiment 2

The signal transmission system of the foregoing embodiment 1 can enable signal transmission without the DC offset by using the modulation signal formed by combining the Manchester code with the duty ratio of 50%.

However, according to the generation algorithm of the modulation signal shown from FIG. 3 to FIG. 6, the data length of the modulation signal varies depending on the value of the transmission data.

The present embodiment 2 shows a signal transmission system in which the data length of the modulation signal is consistent independently of the value of the transmission data when a is not less than 0.5 T and not greater than 1 T.

Figure 7:
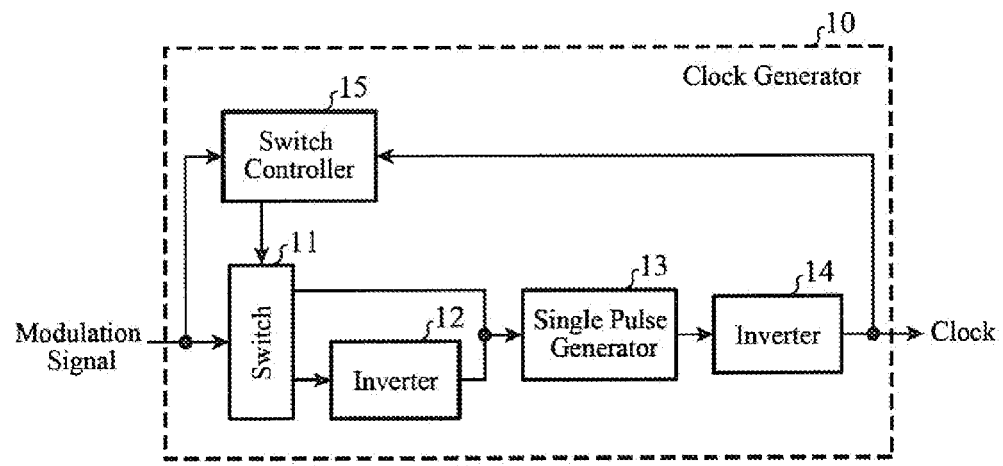
FIG. 7 is a block diagram showing a configuration of a clock generator of a signal transmission system of an embodiment 2 in accordance with the present invention.

FIG. 7 is a block diagram showing a configuration of a clock generator 10 of the embodiment 2 in accordance with the present invention.

The clock generator 10 shown in FIG. 7 comprises a switch 11 that switches an output path of the input modulation signal in response to a switch control signal; an inverter (first inverter) 12 that outputs an inverted value of a first output from the switch 11; a single pulse generator 13 that outputs a pulse with a prescribed width in synchronization with a second output from the switch 11 and the output from the inverter 12; an inverter (second inverter) 14 that outputs an inverted value of the output from the single pulse generator 13 as the clock; and a switch controller 15 that generates a switch control signal by carrying out the sampling processing of the input modulation signal in synchronization with the clock from the inverter 14.

Next, the operation will be described.

The switch 11 selects the output path in response to the switch control signal from the switch controller 15.

Here, if the switch control signal from the switch controller 15 is "0", the switch 11 makes a path connected to the single pulse generator 13, and if the switch control signal from the switch controller 15 is "1", the switch 11 makes a path connected to the inverter 12.

The inverter 12 supplies the single pulse generator 13 with the inverted value of the input (if the input is "0", it outputs "1", or if "1" then "0").

The single pulse generator 13 outputs a pulse with a pulse width αT at every rising edge of the input signal.

The inverter 14 inverts the output from the single pulse generator 13, and supplies it to the outside and the switch controller 15 as the clock.

The switch controller 15 carries out the sampling of the modulation signal in synchronization with the rising edge of the clock, and supplies the value at the sampling to the switch 11.

Figure 8:
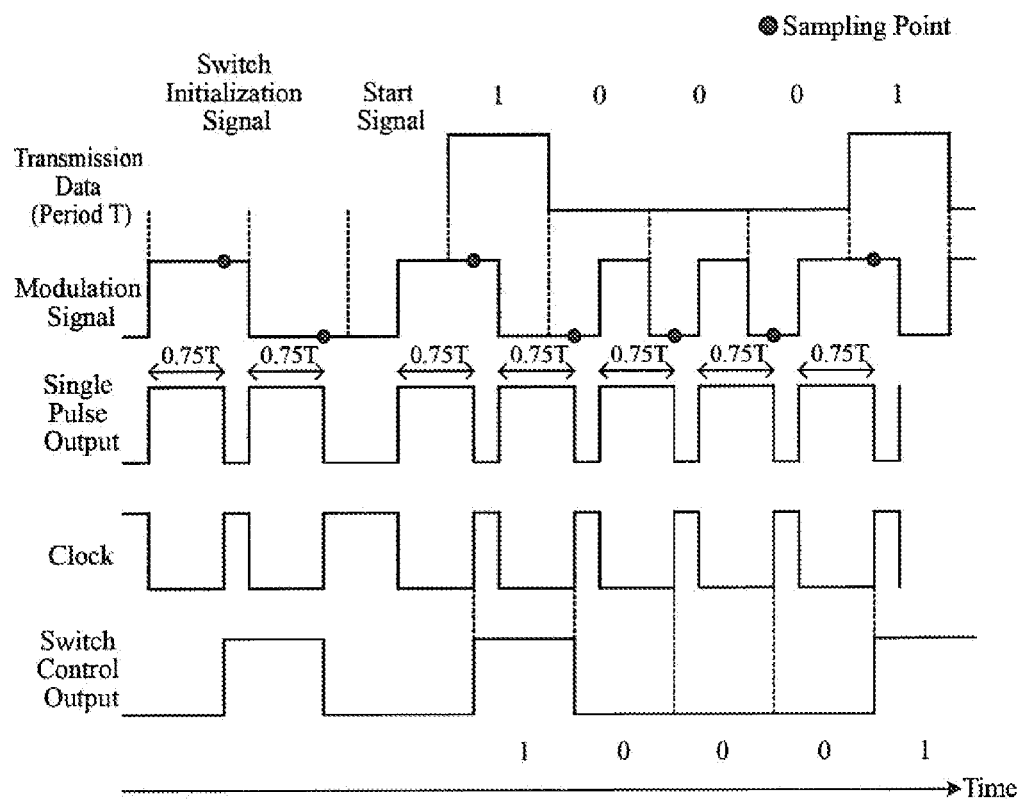
FIG. 8 is a timing chart showing temporal waveforms of various signals.

FIG. 8 shows an example of the temporal waveforms of the transmission data, the modulation signal, the output of the single pulse generator 13, the clock, and the output of the switch controller 15.

To initialize the switch, the modulation signal converter 1 outputs "1" with a period 1 T and "0" with a period 1 T, followed by outputting the Manchester code with the duty ratio of 50% as the start signal, and then outputs the modulation signal generated in response to the transmission data after the start signal.

The single pulse generator 13 outputs a pulse with the pulse width 0.75 T in synchronization with the rising edge or falling edge of the modulation signal with the circuit comprising the switch controller 15, switch 11, and inverter 12.

The clock output from the inverter 14 has a waveform equal to the inversion of the output of the single pulse generator 13.

The switch controller 15 carries out the sampling of the modulation signal in synchronization with the rising edge of the clock. The sampled value is maintained until the rise of the next clock.

Since the switch controller 15 performs the same operation as the data detector 5, the output of the switch controller 15 becomes the decoded received data.

As shown in FIG. 7, the signal transmission system of the embodiment 2 can transmit data correctly.

Figure 9:
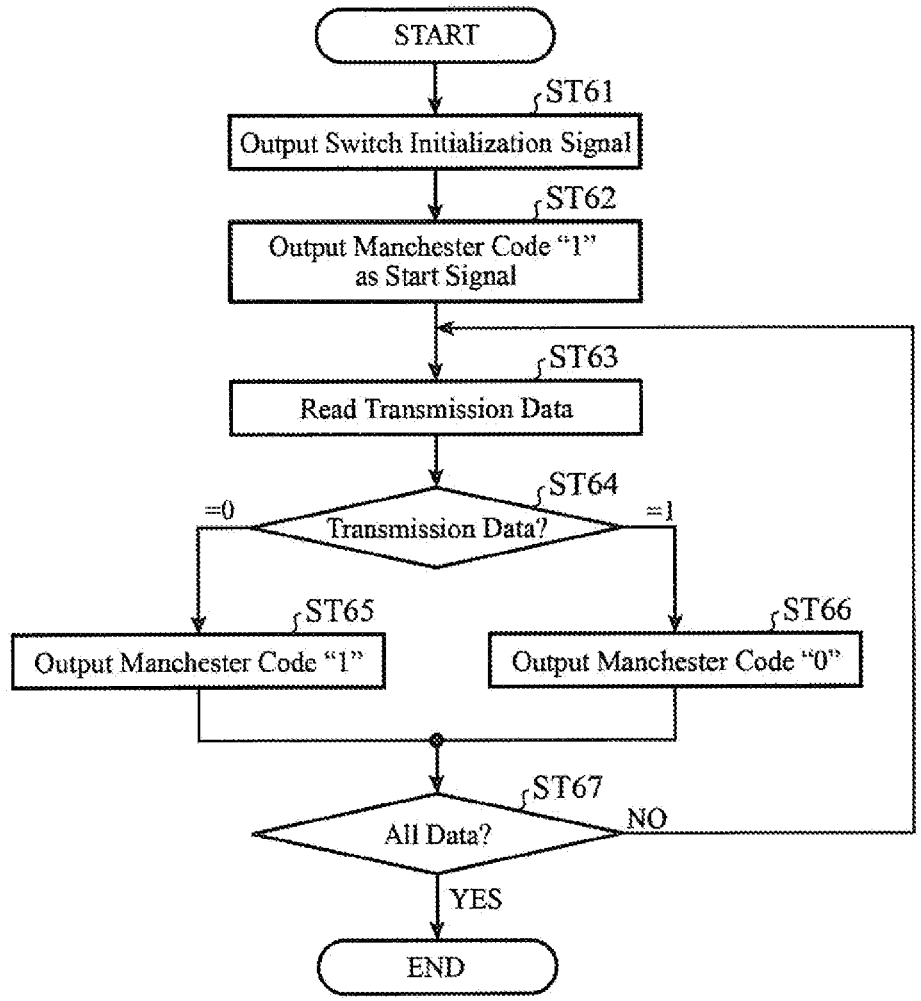
FIG. 9 is a flowchart showing a generation algorithm of a modulation signal.

FIG. 9 shows a generation algorithm of the modulation signal.

First, the modulation signal converter 1 outputs "1" with the period 1 T and "0" with the period 1 T as the switch initialization signal (step ST61).

Then it outputs the Manchester code "1" with the duty ratio of 50% as the start signal (step ST62).

Next, it outputs the Manchester code with the duty ratio of 50% corresponding to the value of the transmission data read (step ST63-ST67).

When the transmission data is "0" (step ST64), it outputs the Manchester code "1" with the duty ratio of 50% (step ST65).

When the transmission data is "1" (step ST64), it outputs the Manchester code "0" with the duty ratio of 50% (step ST66).

Until the conversion of all the transmission data has been completed, it carries out the operation from reading to conversion of the transmission data repeatedly (step ST67).

It will be seen from the generation algorithm of the modulation signal shown in FIG. 9 that the data length of the modulation signal becomes identical independently of the value of the transmission data.

In addition, since the present embodiment 2 generates the modulation signal by combining the Manchester code with the duty ratio of 50%, the duty ratio is always kept at 50% regardless of the transmission data, thereby being able to prevent the DC offset.

The clock generator 10 shown in FIG. 7 determines the output path of the switch 11 by carrying out the sampling of the modulation signal using the switch controller 15.

As described with reference to FIG. 7, the switch controller 15 and the data detector 5 carry out the same operation. Accordingly, as a clock generator 20 shown in FIG. 10, a configuration which supplies the switch 11 with the received data, that is, the output of the data detector 5 can achieve the same advantage.

As described above, besides the advantage of the embodiment 1, the present embodiment 2 can make the data length of the modulation signal equal regardless of the value of the transmission data when a is not less than 0.5 T and not greater than 1 T.

Embodiment 3

The embodiment 2 shows the signal transmission system which makes the data length of the modulation signal equal independently of the value of the transmission data when a is not less than 0.5 T and not greater than 1 T.

However, the generation algorithm of the modulation signal shown in FIG. 9 uses the Manchester code with the duty ratio of 50% which is opposite to the transmission data (if the transmission data is "0", then the Manchester code is "1", and if the transmission data is "1", then the Manchester code is "0").

The present embodiment 3 shows a signal transmission system using the same Manchester code as the transmission data.

Figure 11:
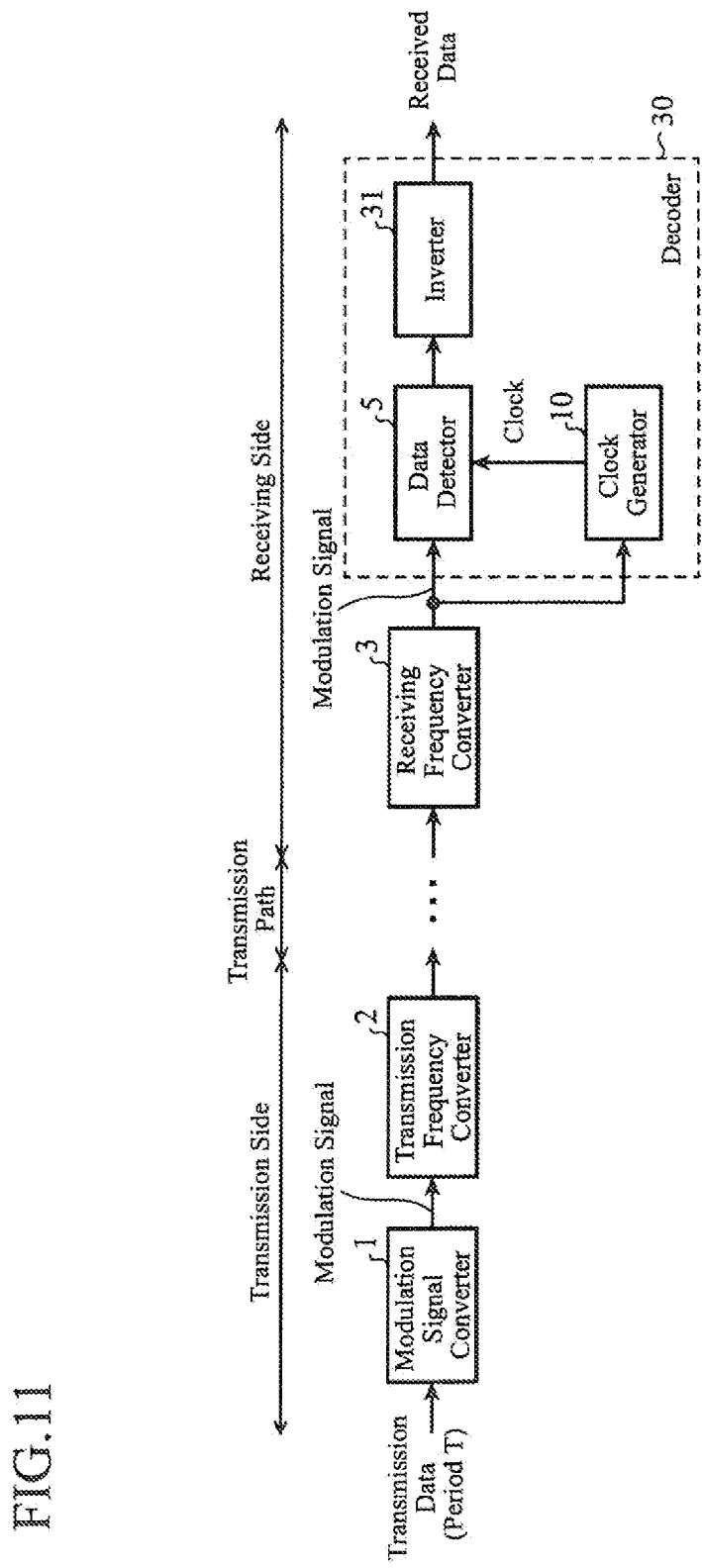
FIG. 11 is a block diagram showing a configuration of a signal transmission system of an embodiment 3 in accordance with the present invention.

FIG. 11 is a block diagram showing a configuration of the signal transmission system of the embodiment 3 in accordance with the present invention.

The signal transmission system shown in FIG. 11 comprises an inverter 31 that outputs the inverted value of the input value at the post-stage of the data detector 5 in the decoder 30 on the receiving side.

Incidentally, it is assumed in the decoder 30 that the clock generator 10 described in the embodiment 2 is used as the clock generator.

Besides, since the same reference numerals as those of the foregoing embodiments designate the same or like components, their description will be omitted.

Next, the operation will be described.

Here, the description of the same operation as the embodiment 1 will be omitted.

The inverter 31 inverts the output of the data detector 5, and outputs as the received data.

Figure 13:
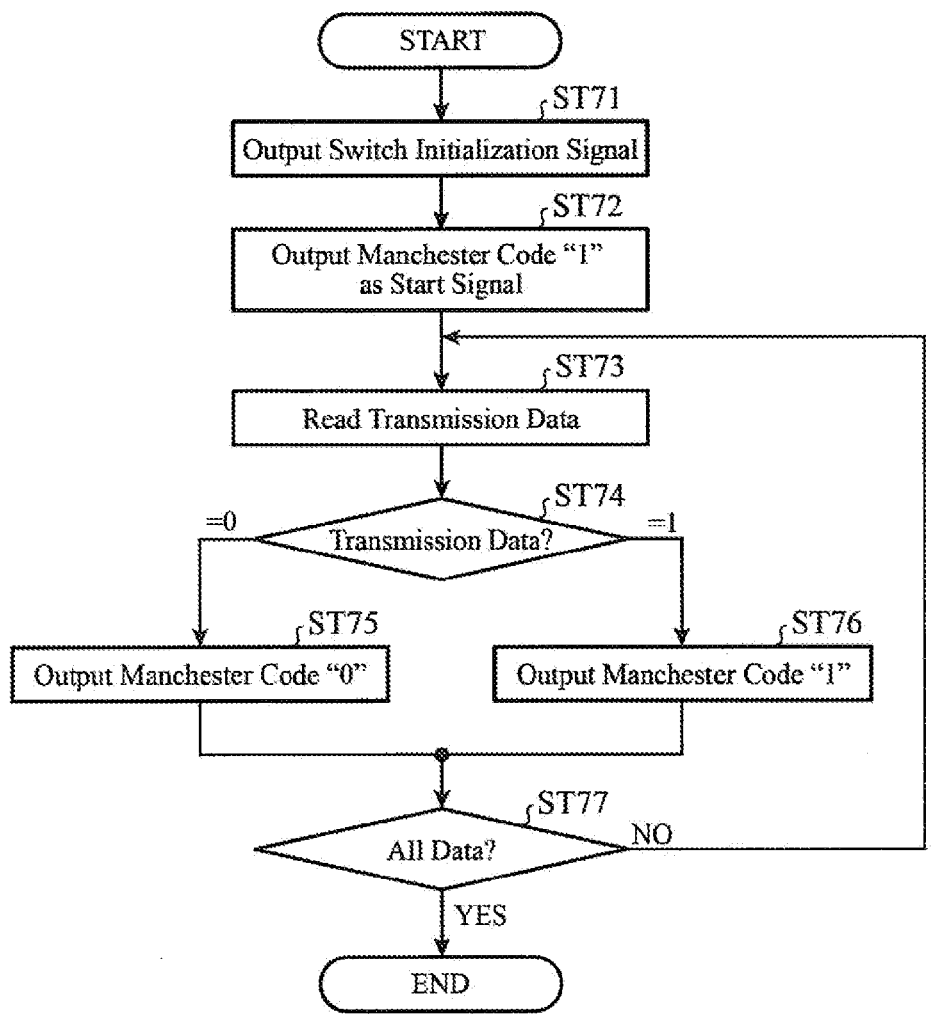
FIG. 13 is a flowchart showing a generation algorithm of the modulation signal.

The inversion operation enables the present embodiment to use the same Manchester code as the transmission data as shown in the generation algorithm of the modulation signal of FIG. 13.

Figure 12:
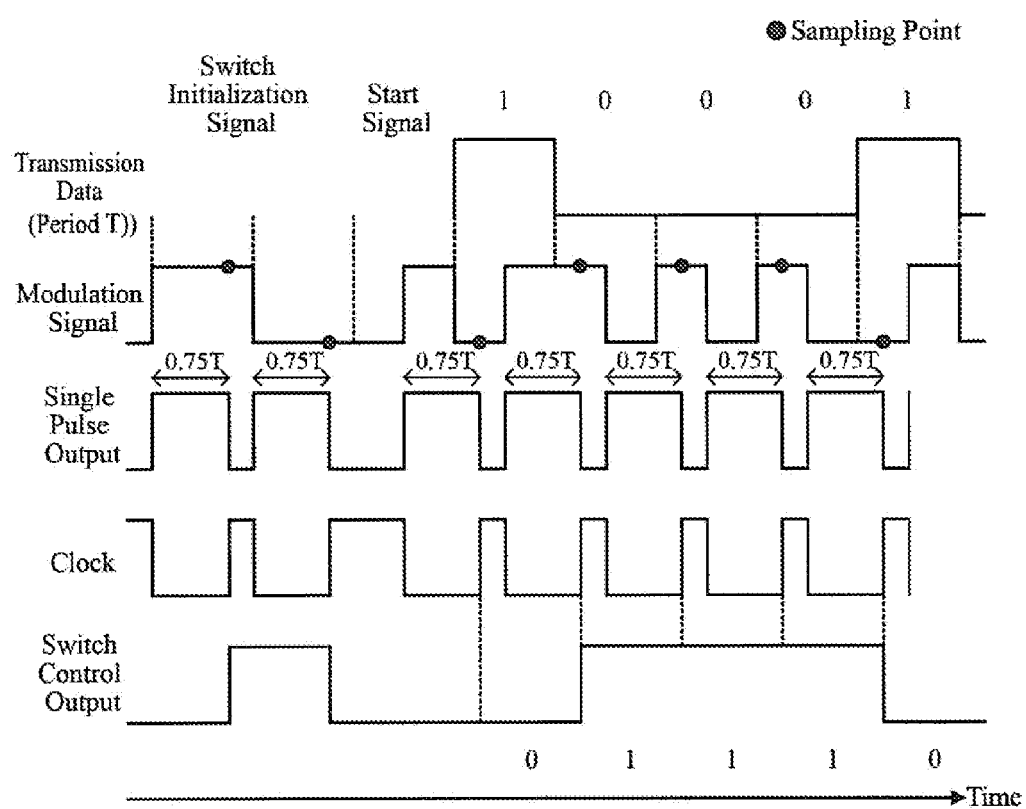
FIG. 12 is a timing chart showing temporal waveforms of various signals.

FIG. 12 shows an example of temporal waveforms of the transmission data, the modulation signal, the output of the single pulse generator 13, the clock, and the output of the switch controller 15.

To initialize the switch, the modulation signal converter 1 outputs "1" with the period 1 T and "0" with the period 1 T, and then outputs the Manchester code with the duty ratio of 50% as the start signal, followed by outputting the modulation signal generated in accordance with the transmission data after the start signal.

The single pulse generator 13 outputs a pulse with a pulse width 0.75 T in synchronization with the rising edge or falling edge of the modulation signal with the circuit comprising the switch controller 15, switch 11, and inverter 12.

The clock output from the inverter 14 has an inverted waveform of the output of the single pulse generator 13.

The switch controller 15 carries out the sampling of the modulation signal in synchronization with the rising edge of the clock. The sampled value is maintained until the rise of the next clock.

The output of the switch controller 15 is the inversion of the transmission data.

Since the switch controller 15 performs the same operation as the data detector 5, placing the inverter 31 at the output of the data detector 5 makes it possible to obtain the same data as the received data.

FIG. 13 shows a generation algorithm of the modulation signal.

First, the modulation signal converter 1 outputs "1" with the period 1 T and "0" with the period 1 T as the switch initialization signal (step ST71).

Then it outputs the Manchester code "1" with the duty ratio of 50% as the start signal (step ST72).

Next, it outputs the Manchester code with the duty ratio of 50% corresponding to the value of the transmission data read (step ST73-ST77).

When the transmission data is "0" (step ST74), it outputs the Manchester code "0" with the duty ratio of 50% (step ST75).

When the transmission data is "1" (step ST74), it outputs the Manchester code "1" with the duty ratio of 50% (step ST76).

Until the conversion of all the transmission data has been completed, it carries out the operation from reading to conversion of the transmission data repeatedly (step ST77).

It will be seen from the generation algorithm of the modulation signal shown in FIG. 13 that the data length of the modulation signal becomes identical independently of the value of the transmission data.

In addition, since the present embodiment 3 generates the modulation signal by combining the Manchester code with the duty ratio of 50%, the duty ratio is always kept at 50% regardless of the transmission data, thereby being able to prevent the DC offset.

The generation algorithm of the modulation signal uses the Manchester code with the duty ratio of 50% corresponding to the transmission data (if the transmission data is "0", then the Manchester code is "0", and if the transmission data is "1", then the Manchester code is "1").

As described above, besides the advantages of the embodiment 1 and the embodiment 2, the present embodiment 3 can use the same Manchester code as the transmission data (if the transmission data is "0", then the Manchester code is "0", and if the transmission data is "1", then the Manchester code is "1").

Incidentally, the switch controller 15 and the data detector 5 carry out the same operation in the embodiment 3 as well.

Figure 10:
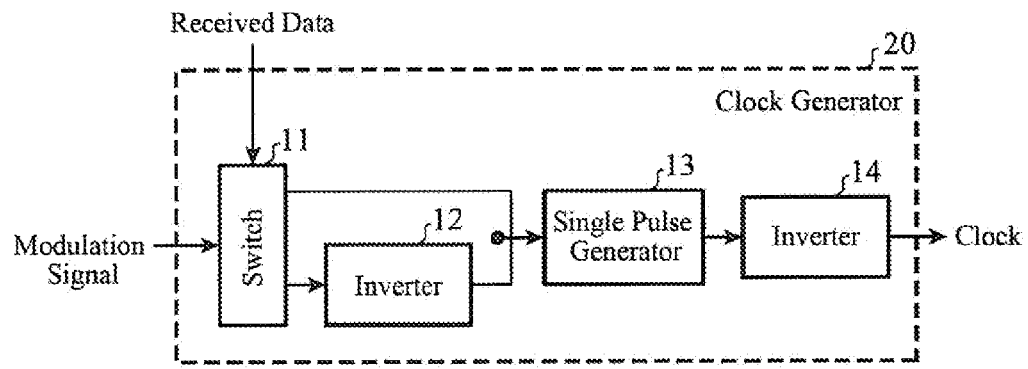
FIG. 10 is a block diagram showing a configuration of another clock generator of the signal transmission system of the embodiment 2 in accordance with the present invention.

Accordingly, a configuration which supplies the received data, that is, the output of the data detector 5 to the switch 11 as shown in FIG. 10 can achieve the same advantage.

In addition, the embodiment 3 describes the example which places the inverter 31 at the post-stage of the data detector 5.

Although not shown in the drawings, placing the inverter 31 at a pre-stage of the data detector 5 can offer the same advantage.

When supplying the received data which is the output of the data detector 5 to the switch 11, however, it is necessary to reverse the path setting of the switch 11 (when the output of the data detector 5 is "0", the switch 11 has the path connected to the inverter 12, and when the output of the data detector 5 is "1", the switch 11 has the path connected to the single pulse generator 13).

Furthermore, in the embodiment 3, the modulation signal converter 1 outputs "1" with the period 1 T and "0" with the period 1 T as the switch initialization signal. As for the period of "1" and "0" of the switch initialization signal, it can be an integer multiple of 0.5 T, offering the same advantage.

In addition, the period of "1" and that of "0" can be the same or different.

Incidentally, it is to be understood that a free combination of the individual embodiments, variations of any components of the individual embodiments or removal of any components of the individual embodiments are possible within the scope of the present invention.

INDUSTRIAL APPLICABILITY

A signal transmission system in accordance with the present invention comprises the modulation signal generating unit that generates the modulation signal using the Manchester code with the duty ratio of 50% corresponding to the transmission data; the clock generating unit that generates the clock having the amount of delay with respect to the rising edge or falling edge of the modulation signal; and the data detecting unit that generates the received data by carrying out the sampling processing of the modulation signal in synchronization with the clock. It offers an advantage of being able to prevent the DC offset from occurring in the modulation signal on the receiving side and to achieve the good communication quality with a simple circuit configuration. Accordingly, it is suitable for applications to wire or wireless communication systems.

DESCRIPTION OF REFERENCE SYMBOLS 1 modulation signal converter (modulation signal generating unit); 2 transmission frequency converter (first frequency converter); 3 receiving frequency converter (second frequency converter); 4, 30 decoder; 5 data detector (data detecting unit); 6, 10, 20 clock generator (clock generating unit); 11 switch; 12 inverter (first inverter); 13 single pulse generator; 14 inverter (second inverter); 15 switch controller; 31 inverter.

What is claimed is:
1. A signal transmission system comprising:
a modulation signal generating unit that generates a modulation signal using a Manchester code in accordance with transmission data;
a clock generating unit that generates a clock having an amount of delay with respect to a rising edge or falling edge of the modulation signal generated by the modulation signal generating unit; and a data detecting unit that generates received data by carrying out sampling processing of the modulation signal generated by the modulation signal generating unit in synchronization with the clock generated by the clock generating unit, wherein when it is assumed that a period of the transmission data is T and the amount of delay in the clock generating unit is not less than 0.5 T and not greater than 1 T, the modulation signal generating unit:

outputs the Manchester code "1" as a start signal;

reads the transmission data;

outputs the Manchester code "1" if the transmission data read is "0";

outputs the Manchester code "0" and the Manchester code "1" if the transmission data read is "1"; and repeats an operation from reading to conversion of the transmission data until conversion and output of all the transmission data have been completed.

2. The signal transmission system according to claim 1, further comprising:

an inverter that is set at a pre-stage or at a post-stage of the data detecting unit and that outputs an inverted value of an input value.

3. The signal transmission system according to claim 1, further comprising:

a first frequency converter that converts the modulation signal generated by the modulation signal generating unit to a desired carrier frequency; and a second frequency converter that converts the modulation signal converted to the desired carrier frequency by the first frequency converter to a baseband frequency.

4. A signal transmission system comprising:

a modulation signal generating unit that generates a modulation signal using a Manchester code in accordance with transmission data;

a clock generating unit that generates a clock having an amount of delay with respect to a rising edge or falling edge of the modulation signal generated by the modulation signal generating unit; and a data detecting unit that generates received data by carrying out sampling processing of the modulation signal generated by the modulation signal generating unit in synchronization with the clock generated by the clock generating unit, wherein when it is assumed that a period of the transmission data is T and the amount of delay in the clock generating unit is not less than 0.5 T and not greater than 1 T, the clock generating unit comprises:

a switch that switches an output path of an input modulation signal in response to a switch control signal;

a first inverter that outputs an inverted value of a first output from the switch;

a single pulse generator that outputs a pulse with a prescribed width in synchronization with a second output of the switch and the output from the first inverter;

a second inverter that outputs an inverted value of the output from the single pulse generator as a clock; and a switch controller that generates the switch control signal by carrying out sampling processing of the input modulation signal in synchronization with the clock from the second inverter.

5. The signal transmission system according to claim 4, wherein the modulation signal generating unit:

outputs an initialization signal of the switch;

outputs the Manchester code "1" as a start signal;

reads the transmission data;

outputs the Manchester code corresponding to the transmission data read; and repeats an operation from reading to conversion of the transmission data until conversion and output of all the transmission data have been completed.

6. The signal transmission system according to claim 5, wherein the modulation signal generating unit:

outputs, as the initialization signal of the switch, "1" with a period of an integer multiple of 0.5 T and "0" with a period of an integer multiple of 0.5 T.

7. A signal transmission system comprising:

a modulation signal generating unit that generates a modulation signal using a Manchester code in accordance with transmission data;

a clock generating unit that generates a clock having an amount of delay with respect to a rising edge or falling edge of the modulation signal generated by the modulation signal generating unit; and a data detecting unit that generates received data by carrying out sampling processing of the modulation signal generated by the modulation signal generating unit in synchronization with the clock generated by the clock generating unit, wherein when it is assumed that a period of the transmission data is T and the amount of delay in the clock generating unit is not less than 0.5 T and not greater than 1 T, the clock generating unit comprises:

a switch that switches an output path of an input modulation signal in response to the received data generated by the data detecting unit;

a first inverter that outputs an inverted value of a first output from the switch;

a single pulse generator that outputs a pulse with a prescribed width in synchronization with a second output of the switch and the output from the first inverter; and a second inverter that outputs an inverted value of the output from the single pulse generator as a clock.

8. The signal transmission system according to claim 7, wherein the modulation signal generating unit:

outputs an initialization signal of the switch;

outputs the Manchester code "1" as a start signal;

reads the transmission data;

outputs the Manchester code corresponding to the transmission data read; and repeats an operation from reading to conversion of the transmission data until conversion and output of all the transmission data have been completed.

9. The signal transmission system according to claim 8, wherein the modulation signal generating unit:

outputs, as the initialization signal of the switch, "1" with a period of an integer multiple of 0.5 T and "0" with a period of an integer multiple of 0.5 T.

* * * * *